(12) United States Patent
Iida

(10) Patent No.: US 9,801,272 B2
(45) Date of Patent: Oct. 24, 2017

(54) ROBOT

(71) Applicant: Seiko Epson Corporation, Tokyo (JP)

(72) Inventor: Izumi Iida, Shiojiri (JP)

(73) Assignee: Seiko Epson Corporation (JP)

( * ) Notice: Subject to any disclaimer, the term of this patent is extended or adjusted under 35 U.S.C. 154(b) by 179 days.

(21) Appl. No.: 14/886,402

(22) Filed: Oct. 19, 2015

(65) Prior Publication Data

US 2016/0120020 A1  Apr. 28, 2016

(30) Foreign Application Priority Data

Oct. 24, 2014 (JP) ................................. 2014-217042

(51) Int. Cl.
| | |
|---|---|
| *H05K 1/02* | (2006.01) |
| *B25J 9/00* | (2006.01) |
| *B25J 19/00* | (2006.01) |
| *H05K 1/14* | (2006.01) |
| *H02G 11/00* | (2006.01) |

(52) U.S. Cl.
CPC ............ *H05K 1/028* (2013.01); *B25J 9/0087* (2013.01); *B25J 19/0029* (2013.01); *H05K 1/025* (2013.01); *H02G 11/006* (2013.01); *H05K 1/144* (2013.01); *H05K 2201/051* (2013.01); *Y10S 901/28* (2013.01)

(58) Field of Classification Search
CPC ...... H05K 1/025; H05K 1/028; H05K 1/0281; H05K 1/0283
See application file for complete search history.

(56) References Cited

U.S. PATENT DOCUMENTS

| | | | |
|---|---|---|---|
| 3,612,744 | A | 10/1971 | Thomas |
| 7,807,927 | B2 | 10/2010 | Yeh |
| 8,338,709 | B2 | 12/2012 | Kodama et al. |
| 8,581,103 | B2 | 11/2013 | Aspas Puertolas |
| 2008/0116988 | A1 | 5/2008 | Blair et al. |
| 2008/0236868 | A1 | 10/2008 | Koga |
| 2013/0056248 | A1 | 3/2013 | Kajiya et al. |
| 2014/0375394 | A1 | 12/2014 | Lin et al. |

FOREIGN PATENT DOCUMENTS

| | | |
|---|---|---|
| JP | 06-021681 A | 1/1994 |
| JP | 2004-029652 A | 1/2004 |
| JP | 2008-210839 A | 9/2008 |
| JP | 2010-214528 A | 9/2010 |
| JP | 2010-214530 A | 9/2010 |
| JP | 2012-045631 A | 3/2012 |
| JP | 2012-060043 A | 3/2012 |
| JP | 2012-160596 A | 8/2012 |
| JP | 2013-187248 A | 9/2013 |

OTHER PUBLICATIONS

Extended European Search Report for Application No. EP 15 19 0994 dated Mar. 14, 2016 (9 pages).

*Primary Examiner* — Jeremy C Norris
(74) *Attorney, Agent, or Firm* — Harness, Dickey & Pierce, P.L.C.

(57) ABSTRACT

A robot includes: a first member; a second member which is provided to be movable with respect to the first member; a connection wiring which is disposed on the first member; and a wiring board which is a flexible printed wiring board which includes a board wiring line connected to the connection wiring and is deformed according to movement of the second member with respect to the first member, in which the characteristic impedance of the connection wiring is included in a change range of the characteristic impedance of the board wiring line corresponding to the deformation of the wiring board.

9 Claims, 7 Drawing Sheets

FIG. 7A
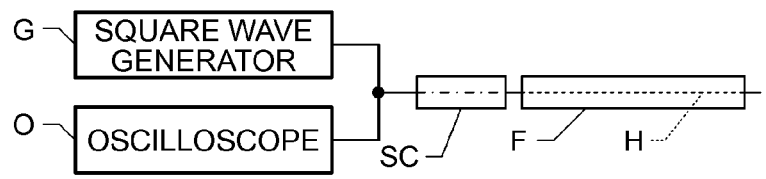
FIG. 7B
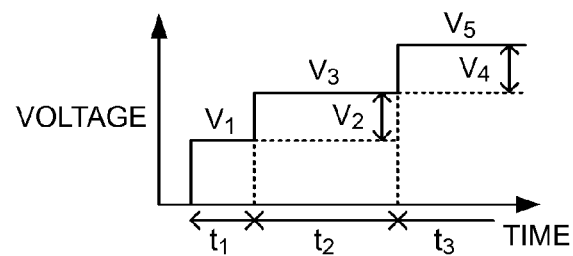
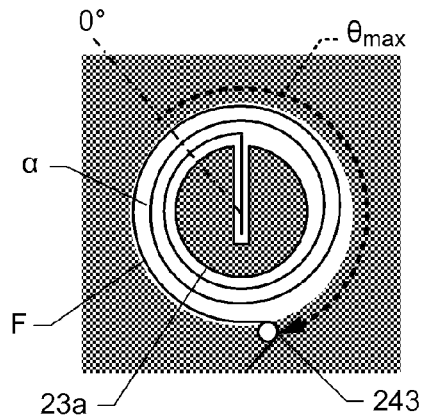
FIG. 7C
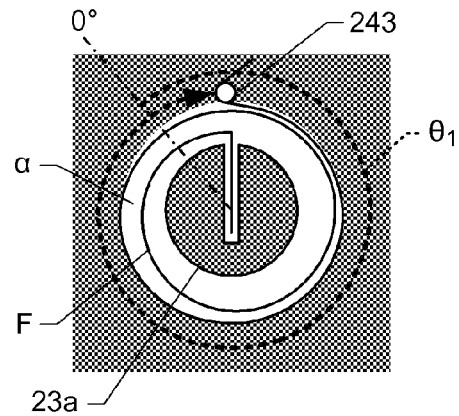
FIG. 7D
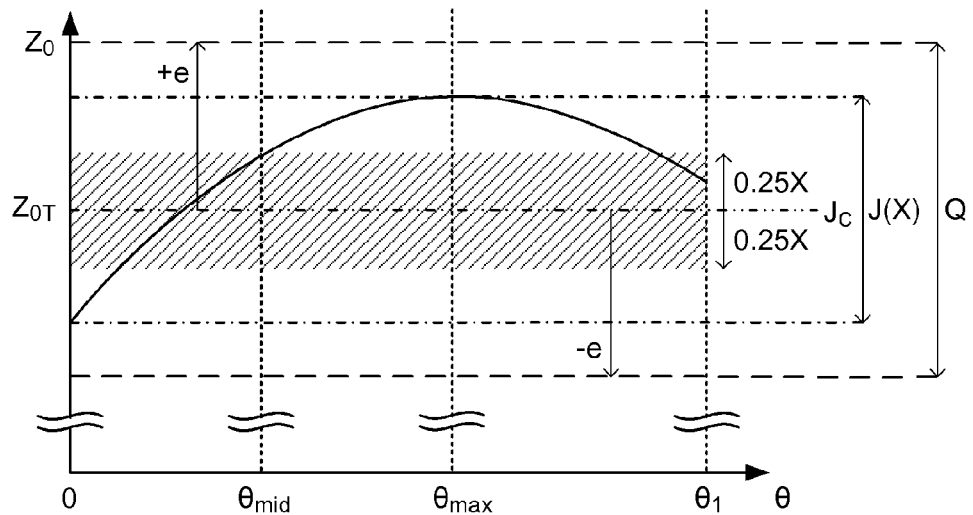
FIG. 7E

ROBOT

BACKGROUND

1. Technical Field

The present invention relates to a robot.

2. Related Art

A technology of using a flexible printed wiring board in wiring in arms of a robot has been known (see JP-A-2010-214530). In addition, a technology of matching characteristic impedance of wiring on a flexible printed wiring board with characteristic impedance of coated wiring connected to the wiring has been known (see JP-A-2008-210839).

However, even when the characteristic impedance is matched in a state where a movable member is moved to a certain position, the flexible printed wiring board is deformed when the movable member is moved to another position, and the characteristic impedance is not matched.

SUMMARY

An advantage of some aspects of the invention is to provide a robot which can match characteristic impedance, even when a movable member is moved.

An aspect of the invention is directed to a robot including: a first member; a second member which is provided to be movable with respect to the first member; a connection wiring which is disposed on the first member; and a wiring board which is a flexible printed wiring board which includes a board wiring line connected to the connection wiring and is deformed according to movement of the second member with respect to the first member, in which the characteristic impedance of the connection wiring is included in a change range of the characteristic impedance of the board wiring line corresponding to the deformation of the wiring board. As described above, since the characteristic impedance of the connection wiring is included in the change range of the characteristic impedance of the board wiring line, it is possible to match the characteristic impedance, even when the second member is moved with respect to the first member.

Since the wiring board is a deformable flexible printed wiring board, the movement of the second member with respect to the first member can be allowed. The board wiring line is wiring which is formed on the wiring board, may be wiring which is formed in a plane direction of the wiring board or may be strictly formed on the surface of the wiring board. For example, the board wiring line may be coated with resist. The connection wiring may be wiring which is not formed at least on the wiring board, may be a cable coated with an insulator, or may be wiring which is formed on a board other than the wiring board.

In addition, an absolute value of a difference between the characteristic impedance of the connection wiring and a center value of the change range may be equal to or smaller than 25% of the entire width of the change range. Here, it can be said that the characteristic impedance of the board wiring line increases or decreases depending on the center value of the change range. Accordingly, as the characteristic impedance of the connection wiring is close to the center value of the change range of the characteristic impedance of the board wiring line, it is possible to change the characteristic impedance of the board wiring line to be close to the characteristic impedance of the connection wiring. Particularly, by suppressing the absolute value of a difference between the characteristic impedance of the connection wiring and the center value of the change range to be equal to or smaller than 25% of the entire width of the change range, it is possible to reliably change the characteristic impedance of the board wiring line to be close to the characteristic impedance of the connection wiring.

Here, the center value of the change range may be an average value of an upper limit value and a lower limit value of the change range, may be a mode when the characteristic impedance of the board wiring line is sampled multiple times, or may be the characteristic impedance of the board wiring line when the second member is moved to the center position of the movement range with respect to the first member.

Further, the characteristic impedance of the connection wiring and a center value of the change range may be equivalent to each other. Therefore, it is possible to more reliably change the characteristic impedance of the board wiring line to be close to the characteristic impedance of the connection wiring.

In addition, the change range of the characteristic impedance of the board wiring line may be included in an allowable range which is set so as to include the characteristic impedance of the connection wiring. In this case, it is possible to change the characteristic impedance of the connection wiring in the allowable range of the characteristic impedance of the board wiring line. The allowable range is a range on design where a change in the characteristic impedance of the board wiring line can be allowed and is an allowable range including the characteristic impedance of the connection wiring. Therefore, it is possible to match the characteristic impedance of the connection wiring and the characteristic impedance of the board wiring line.

Further, a shield board which is a flexible printed wiring board including a conductor and is disposed so that the conductor is overlapped with the wiring board in a thickness direction may be included. In this case, by overlapping the wiring board and the conductor of the shield board each other, it is possible to set a closest conductor from the board wiring line as a conductor of the shield board, and to control the characteristic impedance of the board wiring line with the distance between the wiring board and the shield board. With the shielding effect of the shield board, it is possible to prevent leakage of noise from the board wiring line to the outside and to prevent the mixing of the noise with the board wiring line from the outside. The shield board may be provided only one side of the wiring board in the thickness direction or the wiring board may be interposed with two shield boards in the thickness direction.

In addition, a spacer may be interposed between the wiring board and the shield board. In this case, it is possible to control the distance between the wiring board and the shield board to be equal to or greater than a thickness of the spacer. Therefore, it is possible to suppress an amount of change in the distance between the wiring board and the shield board and to decrease the width of the change range of the characteristic impedance of the board wiring line.

Further, the conductor of the shield board may be connected to the ground. Therefore, it is possible to supply a ground potential to the first member and the second member, without providing a dedicated ground line.

In addition, the wiring board may be formed in a spiral shape in a width direction of the wiring board. By forming the wiring board in a spiral shape, it is possible to allow a change in a relative position of both ends of the wiring board according to a change in a wiring diameter of the spiral shape. In addition, since the deformation of the wiring board can be suppressed to a change in a wiring diameter of the spiral shape, it is possible to suppress a change in the characteristic impedance of the board wiring line corresponding to the deformation of the wiring board.

Here, since the board wiring line has a change range of the characteristic impedance, the characteristic impedance of the connection wiring and the characteristic impedance of the board wiring line may not coincide with each other. Therefore, the connection wiring and the board wiring line may be connected to each other through an attenuator. Therefore, even when the characteristic impedance of the connection wiring and the characteristic impedance of the board wiring line do not coincide with each other, it is possible to prevent reflection of current between the connection wiring and the board wiring line.

BRIEF DESCRIPTION OF THE DRAWINGS

The invention will be described with reference to the accompanying drawings, wherein like numbers reference like elements.

FIG. 7A is an explanatory diagram of a measurement method of characteristic impedance, FIG. 7B is a graph of a voltage, FIGS. 7C and 7D are explanatory diagrams of the board bundle, and FIG. 7E is a graph showing a relationship between a rotation angle and characteristic impedance.

DESCRIPTION OF EXEMPLARY
EMBODIMENTS

Figure 1:
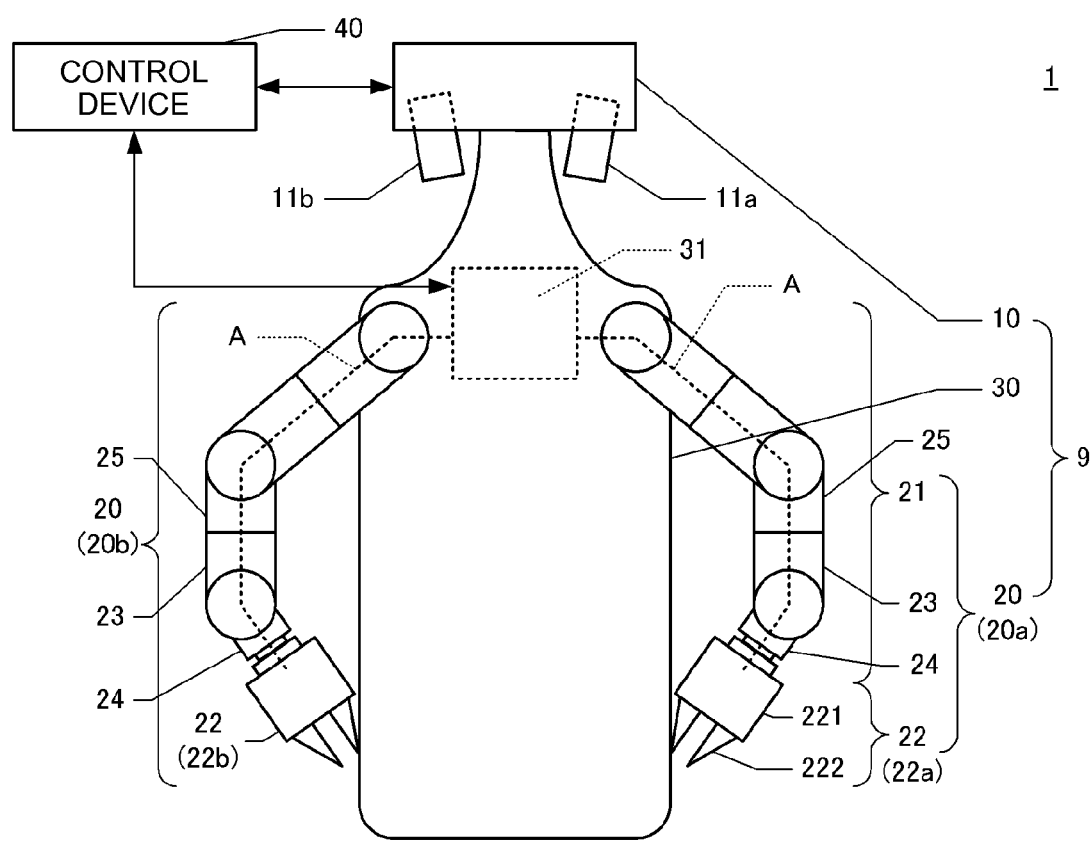
FIG. 1 is a front view of a robot system of one embodiment of the invention.

Hereinafter, embodiments of the invention will be described with reference to the accompanying drawings in the following order. The same reference numerals are used for corresponding constituent elements in each drawing and overlapped description will be omitted.
1. Overall Configuration
2. Configuration of Distal End Portion of Arm
3. Configuration of Transmission Path
4. Measurement Method of Characteristic Impedance
5. Other Embodiments 1. Overall Configuration FIG. 1 is a front view of a robot system 1 of one embodiment of the invention. A robot system 1 includes a robot 9 and a control device 40. The control device 40 is connected to the robot 9 so as to perform communication. This connection is based on wired communication standard such as Ethernet (registered trademark) or Universal Serial Bus (USB) or wireless communication standard such as Wi-Fi (registered trademark). The robot 9 includes an imaging unit 10, hand units 20a and 20b, and a body unit 30. That is, the robot 9 is a dual arm robot including the two hand units 20a and 20b.

The robot 9 acquires a control signal from the control device 40 and performs a predetermined operation with respect to a work based on the acquired control signal. The predetermined operation is, for example, an operation of grasping a work with the hand unit 20 and moving the grasped work from a currently installed position to another position or assembling the work into another device after moving.

The imaging unit 10 is provided on the upper portion of the body unit 30. The imaging unit 10 is, for example, configured with cameras 11a and 11b each including a lens and an imaging element such as a charge coupled device (CCD) or a complementary metal oxide semiconductor (CMOS). The imaging unit 10 images a work which is placed on a working table or a work which is grasped by the hand unit 20 and outputs an captured image of the work to the control device 40 through communication. The robot 9 may not include the imaging unit 10 and may communicate with an external imaging device corresponding to the imaging unit 10.

The hand unit 20 is linked to two portions of the upper portion of the body unit 30. The hand unit 20 includes at least an arm 21 including links of three axes and a hand 22 which is connected to the distal end portion of the arm 21 with a degree of freedom of one axis. Each axis of the hand unit 20 is driven by an actuator (not shown). The hand 22 of the embodiment includes a plurality of fingers 222 which grasp a work and a palm 221 to which the fingers 222 are linked so to be driven.

A control board 31 is provided in the body unit 30 and a control signal is input to the control board 31 from the control device 40. The control board 31 includes a circuit which generates a driving signal for driving an actuator of each axis included in the hand unit 20 based on a control signal from the control device 40 and an angle signal from an encoder attached to the actuator of each axis. In addition, the control board 31 includes a communication circuit for transmitting and receiving a hand control signal to and from the hand 22. A power source generated from a commercial power supply (not shown) is supplied to the control board 31 and a frame ground (FG) potential which is a potential of a housing of the robot 9 is input to the control board. A transmission path A is drawn from the control board 31 and the transmission path A reaches the distal end of the arm 21.

The transmission path A includes a signal line for transmitting the driving signal for driving the actuator of each axis included in the hand unit 20, the angle signal from the encoder attached to the actuator of each axis, and the hand control signal to the hand 22. The transmission path A further includes a power source line for transmitting the power source and an FG line having the same potential as that of the housing of the robot 9. In addition, the distal end of the transmission path A is connected to a control circuit included in the hand 22. Accordingly, it is possible to supply the hand control signal, the FG potential, or the power source to the control circuit which controls each movable unit of the hand 22. In addition, the transmission path A is branched in the middle of the arm 21 and connected to the driving circuit which drives the actuator of each axis included in the arm 21 and the encoder. Accordingly, it is possible to supply the driving signal, the FG potential, or the power source to the driving circuit which drives the actuator of each axis included in the arm 21 and to acquire the angle signal from the encoder. The control board 31 may separately include for each of the right and left hand units 20a and 20b.

2. Configuration of Distal End Portion of Arm

Figure 2A:
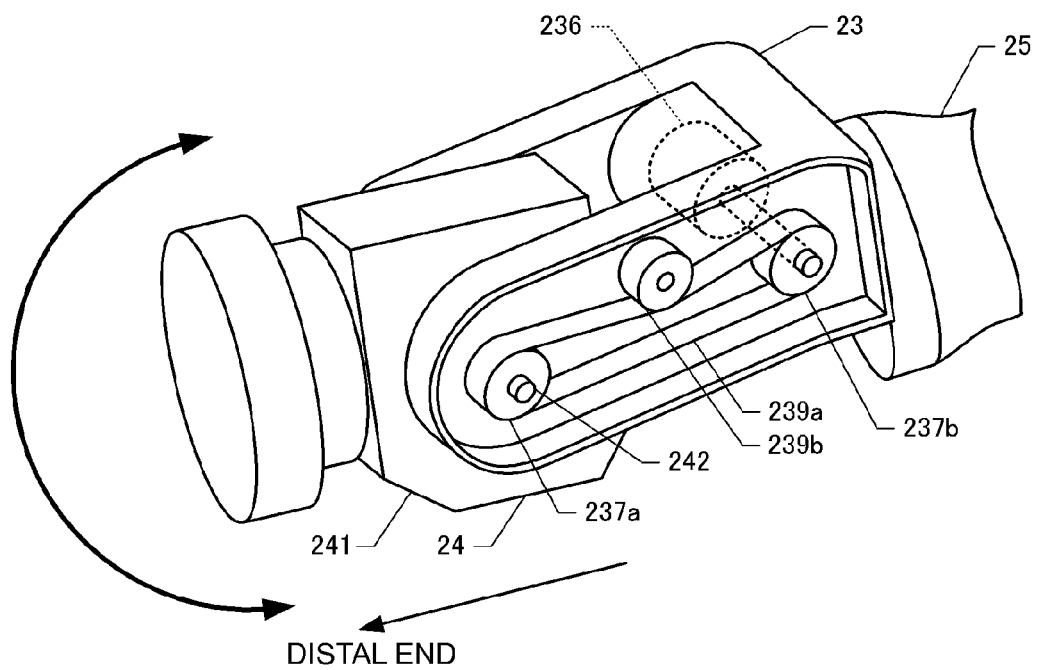
FIGS. 2A and 2B are perspective projection views of the inside of a distal end portion of an arm.
Figure 2B:
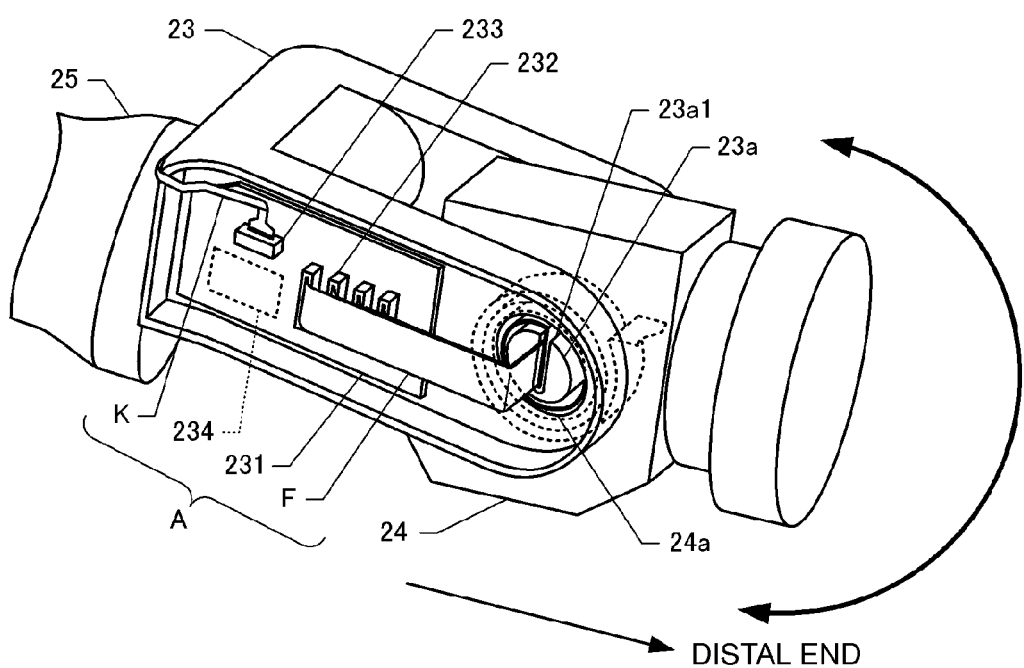

FIGS. 2A and 2B are perspective projection views of the inside of the distal end portion of the arm 21. The distal end portion of the arm 21 includes a first member 23 and a second member 24. The hand 22 can be linked to the distal end of the second member 24 so as to be rotated. The second member 24 is provided to be moved with respect to the first member 23. Specifically, the second member 24 is linked to the first member 23 so as to rotate and move with respect to the first member.

First, a configuration of rotating and moving the second member 24 with respect to the first member 23 will be described. As shown in FIG. 2A, the first member 23 and the second member 24 are linked to each other through a cylindrical rotation shaft 242. The rotation shaft 242 is protruded from the second member 24 and the rotation shaft 242 is supported at a penetration hole (not shown) which is formed on the first member 23. A cylindrical driven pulley 237a is bonded to the rotation shaft 242. By rotating the driven pulley 237a, the rotation shaft 242 to which the driven pulley 237a is bonded is rotated and the second member 24 can be rotated and moved.

The power for rotating the driven pulley 237a is generated by a motor 236. The motor 236 drives by receiving the supply of the power source and the driving signal transmitted by the transmission path A. A cylindrical driving pulley 237b is bonded to a driving shaft of the motor 236 and the driving pulley 237b and the driven pulley 237a are linked to each other by a belt 239a. Accordingly, it is possible to drive the driven pulley 237a with the power of the motor 236. A pulley 239b is provided so as to come into contact with the belt 239a and tension of the belt 239a is appropriately adjusted by the pulley 239b.

3. Configuration of Transmission Path

Next, a portion of the transmission path A which connects the first member 23 and the second member 24 to each other will be described. As described above, the second member 24 rotates and moves with respect to the first member 23, and the transmission path A is configured so as to allow the rotation and movement. FIG. 2B shows a state of the first member 23 and the second member 24 which are seen from the opposite side of FIG. 2A. A circular penetration hole 24a is formed on a side surface of the second member 24 and the internal space of the first member 23 and the internal space of the second member 24 are linked to each other through the penetration hole 24a. A winding core 23a having an approximate cylindrical shape is provided on the first member 23 and the winding core 23a is inserted into the internal space of the second member 24 through the penetration hole 24a. A cross section of the winding core 23a configures a concentric circle with a cross section of the rotation shaft 242. A groove 23a1 is formed by cutting the winding core 23a in a diameter direction and a board bundle F is inserted into the groove 23a1. The board bundle F is a bundle of flexible printed wiring boards and will be specifically described later.

A connection board 231 is accommodated in the first member 23 and a connector 233 is mounted on the connection board 231. A terminal of connection wiring K is connected to the connector 233. The connection wiring K is a cable obtained by coating a conductor with an insulator and may be a commercially available local area network (LAN) cable or the like. The connection wiring K is a cable derived from an arm member 25 which is linked to the body unit 30 side compared to the first member 23, and configures a part of the transmission path A. A plurality of connectors 232 are mounted on the connection board 231 and a terminal of each flexible printed wiring board configuring the board bundle F is connected to the connector 232. A pattern (not shown) for connecting the connector 233 of the connection wiring K and the connectors 232 of the board bundle F is formed on the connection board 231 and a connection circuit 234 configuring an attenuator is formed between the connector 233 and the connectors 232. The connection circuit 234 may be a circuit which performs impedance matching between the connection wiring K and the board bundle F and, for example, may be a circuit in which a plurality of resistors (not shown) are connected in a T type or a π type.

Figure 3:
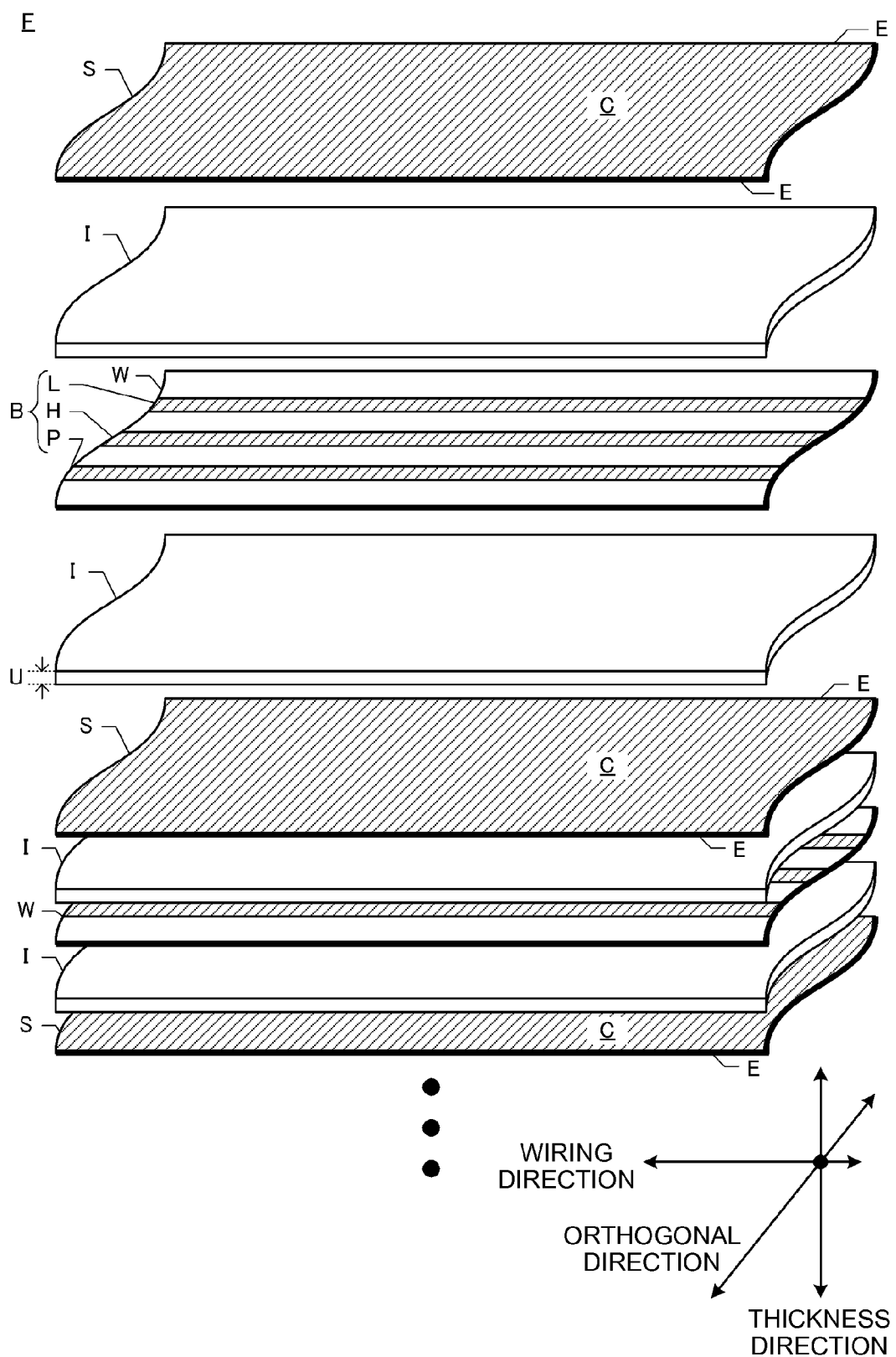
FIG. 3 is a perspective view of a board bundle.

Next, the board bundle F will be described in detail. FIG. 3 is a perspective view showing a configuration of the board bundle F. The board bundle F is formed by overlapping the plurality of flexible printed wiring boards in a thickness direction. A wiring board W and a shield board S are included in the flexible printed wiring boards configuring the board bundle F. The flexible printed wiring board is a printed wiring board having flexibility and may be a board on which a pattern is formed by selectively etching copper foil formed on the entire surface of a base, for example. The flexible printed wiring board of the embodiment is a printed wiring board having a single layer on one side. In the board bundle F, the necessary number of wiring boards W for driving each actuator of the distal end side of the arm 21 compared to the disposition position of the board bundle F is included, and the shield boards S are overlapped so as to interpose each wiring board W from the top and bottom of the paper. In addition, a spacer I having a predetermined thickness U is interposed between the wiring board W and the shield board S.

The wiring board W includes a high frequency signal line H, a low frequency signal line L, and a power source line P as board wiring lines B. Accordingly, the high frequency signal line H and the low frequency signal line L as the board wiring lines B are connected to the connection wiring K through the attenuator (connection circuit 234) and the connectors 232 and 233 and the power source line P as the board wiring line B is connected to the connection wiring K through the connectors 232 and 233. The high frequency signal line H, the low frequency signal line L, and the power source line P have a linear pattern which extends in a wiring direction. The wiring direction means a length direction of the board bundle F and a width direction of the board bundle F means a orthogonal direction which is orthogonal to the wiring direction and the thickness direction of the board bundle F. The high frequency signal line H and the low frequency signal line L are the board wiring lines B which transmit a signal for driving the actuator provided in the distal end side of the arm 21 compared to the second member 24. The power source line P is the board wiring line B which transmits an electrical power to be supplied to the actuator provided in the distal end side of the arm 21 compared to the second member 24. Regarding the frequencies of the signal (current) transmitted through the high frequency signal line H, the low frequency signal line L, and the power source line P, a frequency transmitted through the high frequency signal line H is highest and a frequency transmitted through the power source line P is lowest.

A signal transmitted through the high frequency signal line H may be a digital communication signal which is generated at a predetermined bit rate and a signal transmitted through the low frequency signal line L may be a digital communication signal which is generated at a bit rate lower than that of the signal of the high frequency signal line H.

Each of the high frequency signal line H and the low frequency signal line L may be a differential signal line configured with two lines. The current flowing through the power source line P may be an alternating current (AC power source) and may be a direct current (DC power) having a frequency of 0. The signal transmitted through the high frequency signal line H and the low frequency signal line L is not limited to a simple digital communication signal. For example, the signal thereof may be a radio frequency (RF) signal which is modulated by a high frequency carrier, an analog signal, or a signal subjected to pulse with modulation. In addition, when a bit rate or a carrier frequency is variable, an average value, a maximum value, or a minimum value of a variable frequency band may be a frequency of a modulation signal. In the embodiment, the hand control signal is transmitted to the high frequency signal line H and the encoder signal is transmitted to the low frequency signal line L. Here, the transmission of the electric signal or the power source through the board wiring lines B means that the current flows through the board wiring lines B.

The shield board S is a flexible printed wiring board on which a conductor C having an even thickness is formed over entire board in a plane direction. That is, the shield board S which is a flexible printed wiring board including the conductor C and in which the conductor C is disposed so as to be overlapped with the wiring board W in a thickness direction is provided. The conductor C of the shield board S is electrically connected to a terminal of the FG potential of the control board 31 through the connection wiring K or the like. That is, the conductor C of the shield board S is connected to the ground.

The spacer I is a member having flexibility which is formed of an insulator having an even thickness U. The wiring board W, the shield board S, and the spacer I have the same width and are overlapped so that the end portions in the width direction are assembled. However, in the board bundle F, the wiring board W, the shield board S, and the spacer I are not fixed to each other by bonding or the like. That is, distances between the wiring board W, the shield board S, and the spacer I in the thickness direction are variable and wiring board W, the shield board S, and the spacer I can be shifted in the width direction.

Figure 4A:
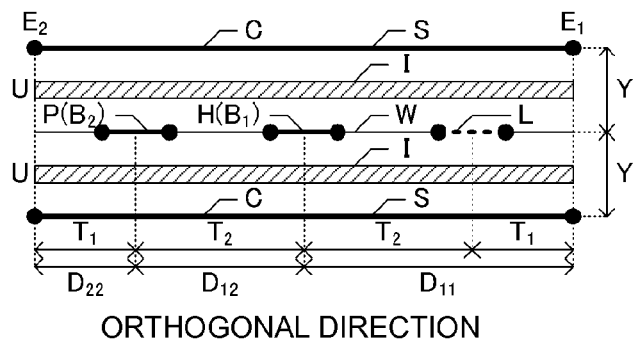
FIGS. 4A to 4D are schematic views showing a positional relationship between board wiring lines and a conductor.
Figure 4B:
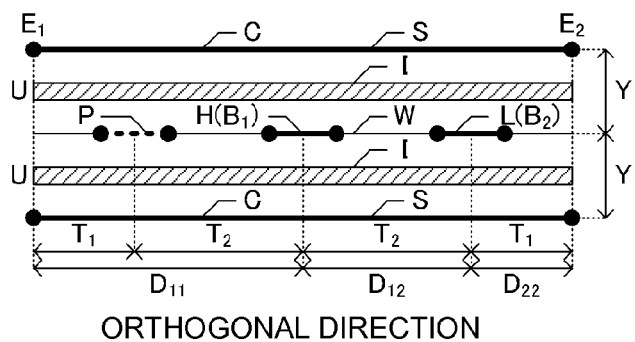
Figure 4C:
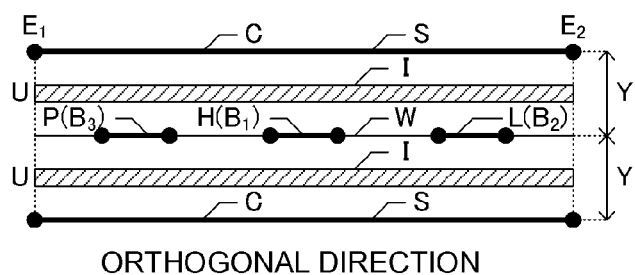

Next, a positional relationship between the board wiring lines B of the wiring board W and the shield board S in the orthogonal direction (width direction of the board bundle F) to the wiring direction will be described. FIGS. 4A to 4C are schematic views of the board bundle F in the wiring direction. As shown in FIGS. 4A to 4C, the power source line P, the high frequency signal line H, and the low frequency signal line L are disposed to be lined in this order from the left side of the paper in the orthogonal direction of the wiring direction. The wiring board W, the shield board S, and the spacer I are overlapped so that the positions of a conductor edge E of the shield board S (conductor C) and edges of the wiring board W and the spacer I coincide with each other in the orthogonal direction of the wiring direction. From the left side of the paper, a distance from the conductor edge E of the conductor C of the shield board S to the power source line P is set as a margin spacing $T_1$, a distance from the power source line P to the high frequency signal line H is set as a conductor spacing $T_2$, a distance from the high frequency signal line H to the low frequency signal line L is set as the conductor spacing $T_2$, and a distance from the low frequency signal line L to the conductor edge E of the conductor C of the shield board S is set as the margin spacing $T_1$. That is, in the embodiment, the high frequency signal line H is positioned on a central line of the board bundle F in the width direction and the power source line P and the low frequency signal line L exist in a position symmetrical to the central line. As described above, by disposing the power source line P, the high frequency signal line H, and the low frequency signal line L in the orthogonal direction of the wiring direction, a relationship regarding the distances described below is satisfied.

In FIG. 4A, a right edge of the conductor C in the paper is considered as a first conductor edge $E_1$. In this case, as shown in FIG. 4A, the first conductor edge $E_1$ which is one end portion (right end of the paper) of the conductor C, the high frequency signal line H as a first board wiring line $B_1$, the power source line P as a second board wiring line $B_2$, and a second conductor edge $E_2$ which is another end portion (left end of the paper) of the conductor C are lined in this order from the right side of the paper in the orthogonal direction of the wiring direction (width direction of the board bundle F). Here, a distance $D_{22}=T_1$ which is from the second conductor edge $E_2$ to the power source line P as the second board wiring line $B_2$ is shorter than a distance $D_{11}=T_1+T_2$ which is from the first conductor edge $E_1$ to the high frequency signal line H as the first board wiring line $B_1$ in the orthogonal direction of the wiring direction (width direction of the board bundle F).

In FIG. 4B, a left edge of the conductor C in the paper is considered as the first conductor edge $E_1$. In this case, as shown in FIG. 4B, the first conductor edge $E_1$ which is one end portion (left end of the paper) of the conductor C, the high frequency signal line H as the first board wiring line $B_1$, the low frequency signal line L as the second board wiring line $B_2$, and the second conductor edge $E_2$ which is another end portion (right end of the paper) of the conductor C are lined in this order from the left side of the paper in the orthogonal direction of the wiring direction (width direction of the board bundle F). Here, the distance $D_{22}=T_1$ which is from the second conductor edge $E_2$ to the low frequency signal line L as the second board wiring line $B_2$ is shorter than the distance $D_{11}=T_1+T_2$ which is from the first conductor edge $E_1$ to the high frequency signal line H as the first board wiring line $B_1$ in the orthogonal direction of the wiring direction (width direction of the board bundle F).

In addition, when a frequency of the current flowing through the high frequency signal line H is set as a first frequency, a frequency of the current flowing through the low frequency signal line L is set as a second frequency, and a frequency of the current flowing through the power source line P is set as a third frequency, both of the second frequency and the third frequency are lower than the first frequency. That is, the wiring board W includes the power source line P as a third board wiring line $B_3$ through which the current having the third frequency which is a frequency lower than the first frequency flows. Accordingly, as shown in FIG. 4C, the high frequency signal line H as the first board wiring line $B_1$ is positioned between the low frequency signal line L as the second board wiring line $B_2$ and the power source line P as the third board wiring line $B_3$ in the orthogonal direction of the wiring direction (width direction of the board bundle F).

Figure 5A:
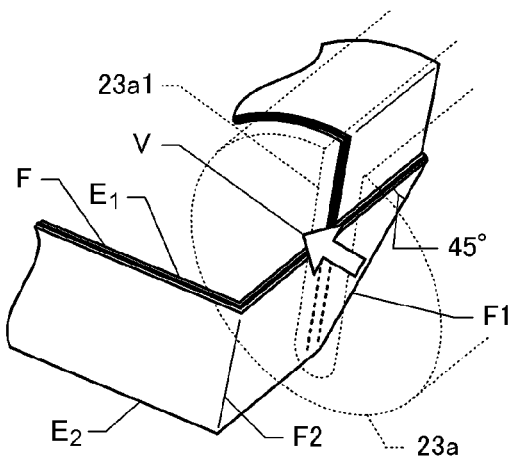
FIG. 5A is a perspective view of a board bundle and FIGS. 5B to 5D are explanatory diagrams of the board bundle.

FIG. 5A is a perspective view showing the shape of the board bundle F. FIG. 5A is an enlarged diagram of the vicinity of the winding core 23a of FIG. 2B. As shown in FIG. 5A, the board bundle F is folded so that a folding line F1 is formed at an angle of 45° with respect to the first conductor edge $E_1$ and the second conductor edge $E_2$. That is, the wiring board W and a shield board S are folded along the folding line F1 in a direction not orthogonal to the direction of the first conductor edge $E_1$ and the second conductor edge $E_2$. By folding the board bundle F, the board bundle F can be inserted into and bound by the groove 23a1 of the winding core 23a and the wiring direction of the wiring board W can be changed by 90°. As described above, by folding the board bundle F, it is possible to change the wiring direction and to increase a degree of disposition freedom of the board bundle F. The board bundle F derived from the groove 23a1 in an axial direction of the winding core 23a is folded so that a folding line F2 orthogonal to the direction of the first conductor edge $E_1$ and the second conductor edge $E_2$ is formed. Meanwhile, the board bundle F derived from the groove 23a1 in the diameter direction of the winding core 23a is wound on a side surface of the winding core 23a and the winding direction of the current is a circumferential direction of the cross section of the winding core 23a.

Figure 5B:
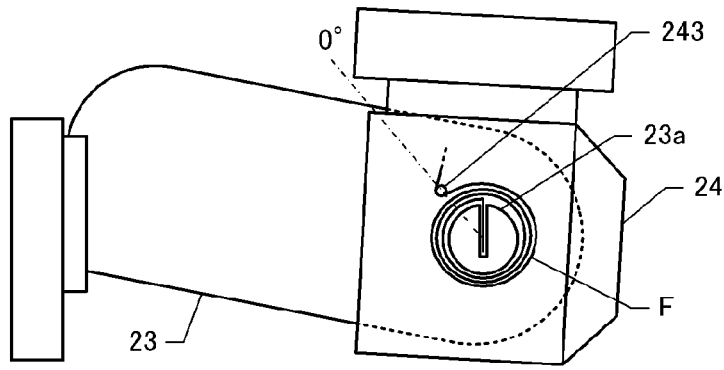
Figure 5C:
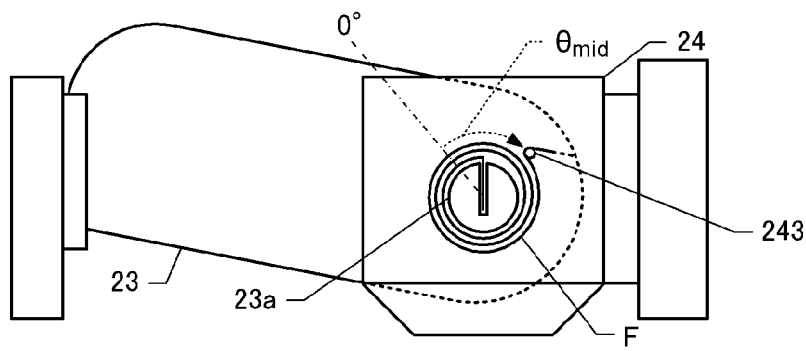
Figure 5D:
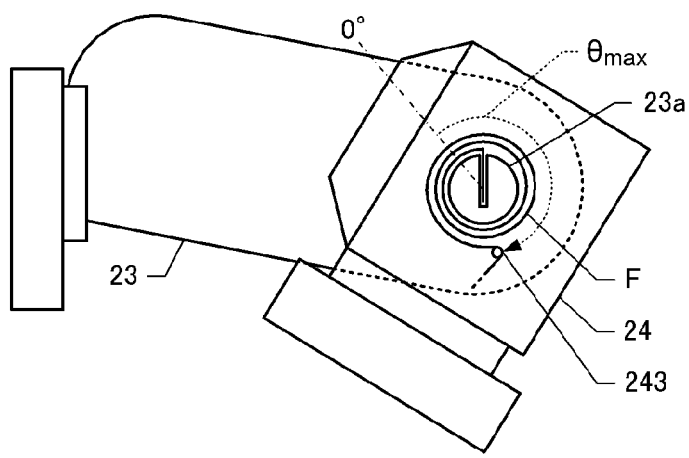

FIGS. 5B to 5D are explanatory diagrams of the board bundle F. As shown in FIGS. 5B to 5D, the board bundle F is wound on the winding core 23a counterclockwise in the paper. In the orthogonal direction which is orthogonal to the wiring direction and the thickness direction of the wiring board W, the wiring board W and the shield board S are formed in a spiral shape. As described above, by setting the board bundle F in a spiral shape, the board bundle F can be disposed in a compact state, even when the board bundle F is formed to be long in the wiring direction. The board bundle F wound on the wiring core 23a is derived towards a fixing point 243 provided on the second member 24 and the board bundle F is fixed to the fixing point 243. When the second member 24 is rotated and moved with respect to the first member 23, the winding core 23a is not rotated and the fixing point 243 is moved on a circular arc track using the winding core 23a as the center. FIG. 5B shows a state where the second member 24 is rotated in counterclockwise of the paper to the end in a movable range and a rotation angle $\theta$ of the fixing point 243 at this time is defined as 0°. FIG. 5D shows a state where the second member 24 is rotated in clockwise of the paper to the end in a movable range and a rotation angle $\theta$ of the fixing point 243 at this time is defined as $\theta_{max}$. FIG. 5C shows a state where the second member 24 is rotated at an intermediate point in a movable range and a rotation angle $\theta$ of the fixing point 243 at this time is defined as $\theta_{mid} = \theta_{max}/2$.

As shown in FIGS. 5B to 5D, as the rotation angle $\theta$ of the fixing point 243 is decreased, the fixing point 243 moves in a winding direction (counterclockwise of the paper) and the board bundle F having a spiral shape is clamped. That is, the wiring board W is deformed so as to decrease a winding diameter according to the movement of the second member 24 (decrease in rotation angle $\theta$) with respect to the first member 23. In addition, as the rotation angle $\theta$ of the fixing point 243 is decreased, the distance between the constituent elements of the board bundle F in a spiral shape in the thickness direction is decreased and the distance between the wiring board W and a shield board S in the thickness direction (hereinafter, inter-board distance Y) is also decreased. Here, the inter-board distance Y is not equal to or smaller than the thickness U of the spacer I.

In contrast, as the rotation angle $\theta$ of the fixing point 243 is increased, the fixing point 243 moves in a direction opposite to the winding direction (counterclockwise of the paper) and the clamping of the board bundle F having a spiral shape is alleviated. Accordingly, as the rotation angle $\theta$ of the fixing point 243 is increased, the distance between the constituent elements of the board bundle F in a spiral shape is increased and the inter-board distance Y is also increased.

Figure 6A:
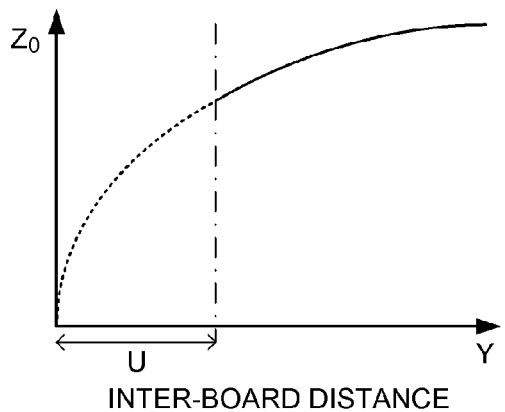
FIG. 6A is a graph showing a relationship between an inter-board distance and characteristic impedance.

FIG. 6A is a graph showing a relationship between characteristic impedance of the high frequency signal line H and the inter-board distance Y. A vertical axis of FIG. 6A indicates characteristic impedance $Z_0$ of the high frequency signal line H and a horizontal axis indicates the inter-board distance Y (see FIGS. 4A to 4C). As shown in FIG. 6A, the characteristic impedance $Z_0$ increases as the inter-board distance Y increases, and the characteristic impedance $Z_0$ has a property of decreasing inclination as the inter-board distance Y increases. That is, as the inter-board distance Y has a small range, an amount of change of the characteristic impedance $Z_0$ increases depending on the change in the inter-board distance Y. Here, since the inter-board distance Y is not equal to or smaller than the thickness U of the spacer I, the characteristic impedance $Z_0$ changes only in a range (solid line) corresponding to the inter-board distance Y equal to or greater than the thickness U of the spacer I.

That is, even when the inter-board distance Y changes, the characteristic impedance $Z_0$ changes only in a range to have small inclination, and it is possible to suppress an amount of change in the characteristic impedance $Z_0$. Although not shown, regarding the low frequency signal line L and the power source line P, it is also possible to suppress an amount of change in the characteristic impedance $Z_0$ by the spacer I. As the thickness of the spacer I is great, it is possible to suppress an amount of change in the characteristic impedance $Z_0$ of the high frequency signal line H, and accordingly, it is desirable that the thickness of the spacer I is great in a range where a degree of flexibility of the spacer I is equal to or greater than a predetermined reference. In addition, both of the inter-board distance Y and the degree of flexibility of the spacer I may be satisfied by interposing two or more spacers I between the wiring board W and a shield board S.

The characteristic impedance $Z_0$ of the high frequency signal line H can be dependent on the inter-board distance Y by overlapping the wiring board W and a shield board S in the thickness direction and the characteristic impedance $Z_0$ of the high frequency signal line H can be controlled by controlling the inter-board distance Y. With the shielding effect of the shield board S, it is possible to prevent leakage of noise from the high frequency signal line H to the outside and to prevent the mixing of the noise with the high frequency signal line H from the outside. Regarding the low frequency signal line L and the power source line P, the same effects are obtained.

Figure 6D:
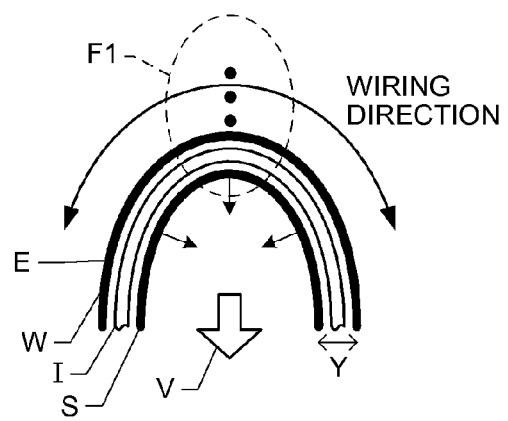
FIG. 6D is a schematic view of a folding line of the board bundle.
Figure 6B:
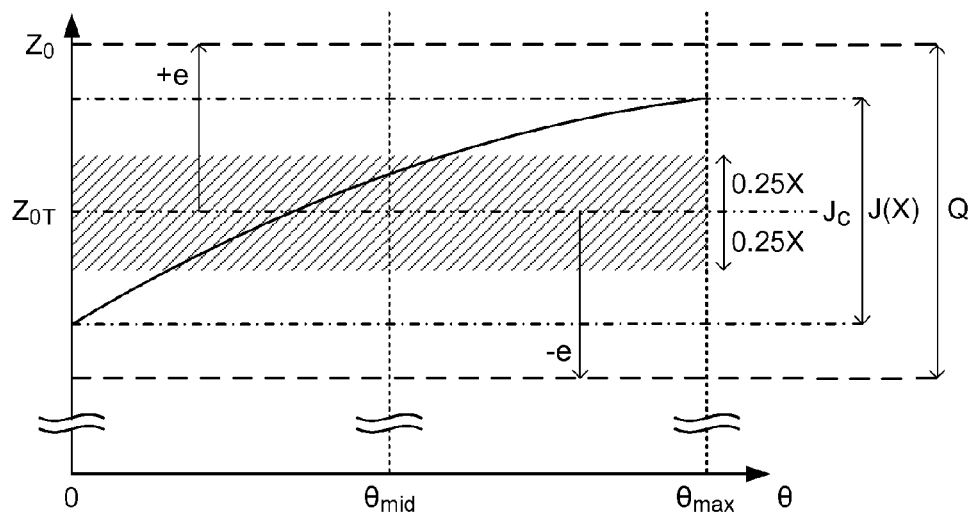
FIGS. 6B and 6C are graphs showing a relationship between a rotation angle and characteristic impedance.
Figure 6C:
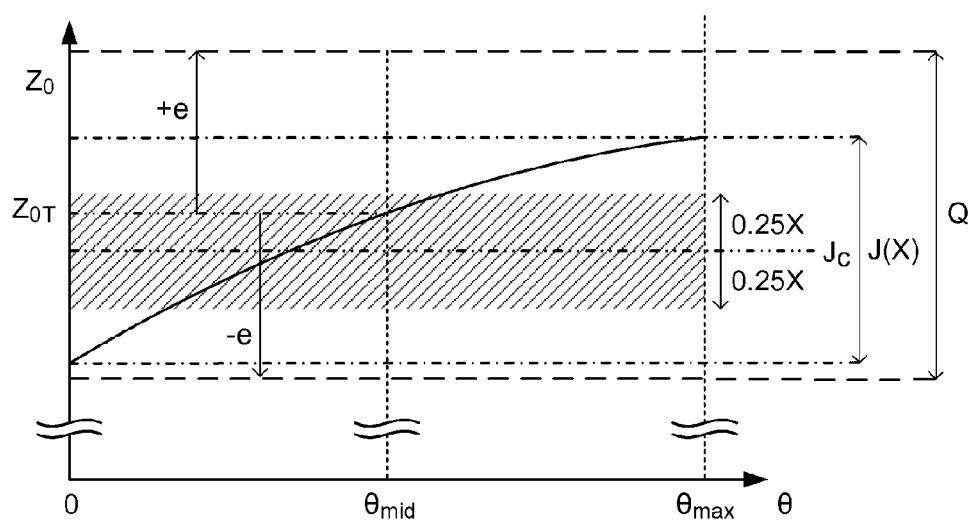

FIGS. 6B and 6C are graphs showing a relationship between the characteristic impedance of the high frequency signal line H and the rotation angle $\theta$. A vertical axis of FIGS. 6B and 6C indicates the characteristic impedance $Z_0$ and a horizontal axis indicates the rotation angle $\theta$ (see FIGS. 5B to 5D). As described above, as the rotation angle $\theta$ increases, the inter-board distance Y increases, and accordingly, as the rotation angle $\theta$ increases, the characteristic impedance $Z_0$ increases. As shown in FIG. 6B, in the embodiment, characteristic impedance $Z_{0T}$ of the signal line connected to the high frequency signal line H among the connection wiring K is included in a change range J of the characteristic impedance $Z_0$ of the high frequency signal line H (board wiring lines B) according to the deformation of the wiring board W.

As shown in FIG. 6B, an absolute value of a difference between the characteristic impedance $Z_{0T}$ of the signal line connected to the high frequency signal line H among the connection wiring K and a center value $J_c$ of the change range J is equal to or smaller than 25% of the entire width X of the change range J. The center value $J_c$ of the change range J is an average value (alternate long and two short dashes line of FIG. 6B) of an upper limit value and a lower limit value of the change range J. In FIG. 6B, a range where the absolute value of a difference between the characteristic impedance $Z_{OT}$ of the connection wiring K and the center value is equal to or smaller than 25% of the entire width X of the change range J is shown with hatching. As shown in FIG. 6B, in the embodiment, the characteristic impedance $Z_{OT}$ of the connection wiring K and the center value $J_c$ of the change range J are equivalent to each other. That is, since the absolute value between the characteristic impedance $Z_{OT}$ of the connection wiring K and the center value $J_c$ of the change range J is 0, the absolute value is equal to or smaller than 25% of the entire width X of the change range J.

As shown in FIG. 6B, the change range J is included in an allowable range Q which is set so as to include the characteristic impedance $Z_{OT}$ of the connection wiring K. In the embodiment, the allowable range Q is a range from a lower limit value obtained by subtracting an allowable error e from the characteristic impedance $Z_{OT}$ of the connection wiring K to an upper limit value obtained by adding the allowable error e to the characteristic impedance $Z_{OT}$ of the connection wiring K. The allowable error e is, for example, a value obtained by multiplying a predetermined rate (for example, 10%) by the characteristic impedance $Z_{OT}$ of the connection wiring K. For example, a maximum value and a minimum value of the characteristic impedance $Z_0$ of the high frequency signal line H may be investigated while changing the rotation angle θ and a width or a thickness of the high frequency signal line H may be designed so that the maximum value and the minimum value are in the allowable range Q.

In the embodiment, the characteristic impedance $Z_0$ monotonously increases with respect to the rotation angle θ. Accordingly, as shown in FIG. 6C, a width or a thickness of the high frequency signal line H may be designed so that the characteristic impedance $Z_0$ of the high frequency signal line H becomes the same as the characteristic impedance $Z_{OT}$ of the connection wiring K when the rotation angle θ is the intermediate rotation angle $θ=θ_{mid}/2$. Therefore, it is possible to change the characteristic impedance $Z_0$ of the high frequency signal line H with good balance in the vicinity of the characteristic impedance $Z_{OT}$ of the connection wiring K. That is, since the characteristic impedance $Z_0$ of the high frequency signal line H changes to be biased in a larger range or a smaller range than the characteristic impedance $Z_{OT}$ of the connection wiring K, it is possible to prevent the value to be beyond the allowable range Q. Even in FIG. 6C, an absolute value of a difference between the characteristic impedance $Z_{OT}$ of the signal line connected to the high frequency signal line H among the connection wiring K and the center value $J_c$ of the change range J is equal to or smaller than 25% of the entire width X of the change range J. Even in FIG. 6C, the change range J is included in the allowable range Q which is set so as to include the characteristic impedance $Z_{OT}$ of the connection wiring K.

Since the characteristic impedance $Z_0$ of the high frequency signal line H changes in the change range J, a matching property between the characteristic impedance $Z_0$ of the high frequency signal line H and the characteristic impedance $Z_{OT}$ of the connection wiring K may be deteriorated depending on the rotation angle θ. With respect to this, in the embodiment, since the connection wiring K and the high frequency signal line H are connected to each other through an attenuator (connection circuit 234), it is possible to prevent reflection caused by mismatch of the characteristic impedance $Z_0$ between the connection wiring K and the high frequency signal line H.

As described above, a configuration of matching the characteristic impedance $Z_0$ of the high frequency signal line H with the connection wiring K has been described, but a configuration of matching the characteristic impedance of the power source line P of the low frequency signal line L as the board wiring lines B can also be realized in the same manner.

As described above, the change in the characteristic impedance $Z_0$ with the assumption that the board wiring lines B of the wiring board W are overlapped with the conductor C of the shield board S in the thickness direction has been described. However, when an operation of rotating and moving the second member 24 with respect to the first member 23 is repeatedly performed, the board wiring lines B may not be overlapped with the conductor C of the shield board S in the thickness direction. This is because that, when a force in the orthogonal direction (width direction) of the wiring direction is operated with respect to the wiring board W or the shield board 5, there is a possibility that the wiring board W and the shield board S are shifted in the orthogonal direction of the wiring direction. For example, a force for shifting the wiring board W and the shield board S in the orthogonal direction of the wiring direction can be generated when the board bundle F interferes other constituent components of the second member 24 with respect to the first member 23 in the orthogonal direction of the wiring direction.

In addition, the force for shifting the wiring board W and the shield board S in the orthogonal direction of the wiring direction can be generated in the folding line F1 shown in FIG. 5A. FIG. 6D is an enlarged view of the board edge E in the vicinity of the folding line F1. As described above, when the inter-board distance Y changes depending on the change in the rotation angle θ and the inter-board distance Y approaches 0, the board on the outer side presses the board which comes into contact with the inner side of the board on the outer side toward the inner side in the vicinity of folding line F1. In the vicinity of folding line F1, a resultant force V of forces for pressing the board on the inner side is formed in the direction orthogonal to the folding line F1 by forces (black arrow) toward which the board on the outer side presses the board which comes into contact with the inner side of the board on the outer side toward the inner side. As shown in FIG. 5A, when a direction of the folding line F1 is a direction not orthogonal to the direction of the conductor edge E of the shield board S, the resultant force V includes a component of force in a direction not parallel to the conductor edge E, that is, a force for shifting the wiring board W and the shield board S in the orthogonal direction of the wiring direction.

Figure 4D:
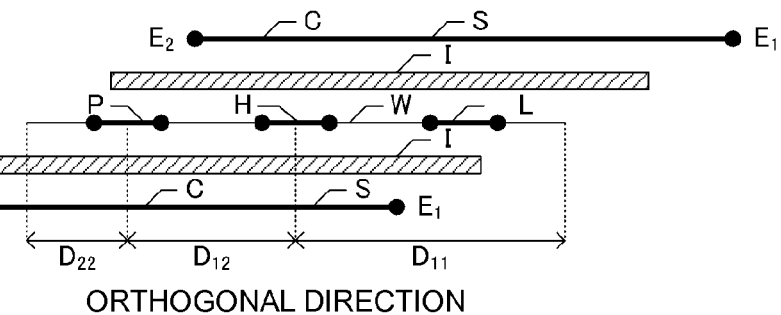

FIG. 4D is a schematic view showing a state where the wiring board W and the shield board S are shifted in the orthogonal direction of the wiring direction. In FIG. 4D, the shield board S on the upper side of the paper is shifted in the right direction of the paper and the shield board S on the lower side of the paper is shifted in the left direction of the paper. As shown in the drawing, the power source line P is not overlapped with the conductor C of the shield board S on the upper side and the low frequency signal line L is not overlapped with the conductor C of the shield board S on the lower side. With respect to this, the high frequency signal line H is overlapped with both of the conductor C of the shield board S on the upper side of the paper and the conductor C of the shield board S on the lower side of the paper, and the change range J of the characteristic impedance $Z_0$ shown in FIG. 6B can be maintained.

As shown in FIG. 4C, since the high frequency signal line H as the first board wiring line $B_1$ is positioned between the low frequency signal line L as the second board wiring line $B_2$ and the power source line P as a third board wiring line $B_3$ in the orthogonal direction of the wiring direction, the characteristic impedance $Z_0$ of the high frequency signal line H can be matched with the connection wiring K in preference to the low frequency signal line L and the power source line P. Therefore, it is possible to reliably transmit a signal having a higher frequency through the high frequency signal line H. Here, as shown in FIG. 4A, since the distance $D_{22}=T_1$ which is from the second conductor edge $E_2$ to the power source line P as the second board wiring line $B_2$ is shorter than the distance $D_{11}=T_1+T_2$ which is from the first conductor edge $E_1$ to the high frequency signal line H as the first board wiring line $B_1$ in the orthogonal direction of the wiring direction, the connection wiring K can be matched with the characteristic impedance $Z_0$ of the high frequency signal line H in preference to the power source line P. As shown in FIG. 4B, since the distance $D_{22}=T_1$ which is from the second conductor edge $E_2$ to the low frequency signal line L as the second board wiring line $B_2$ is shorter than the distance $D_{11}=T_1+T_2$ which is from the first conductor edge $E_1$ to the high frequency signal line H as the first wiring line $B_1$ in the orthogonal direction of the wiring direction, the connection wiring K can be matched with the characteristic impedance $Z_0$ of the high frequency signal line H in preference to the low frequency signal line L.

4. Measurement Method of Characteristic Impedance

FIG. 7A is an explanatory diagram of a device configuration for measuring the characteristic impedance. As shown in FIG. 7A, a square wave generator G, an oscilloscope O, and a standard cable SC are used in order to measure the characteristic impedance of the board bundle F (high frequency signal line H). The square wave generator G is a device which outputs a square wave of a voltage from an output terminal. The standard cable SC is a well-known cable (for example, a coaxial cable) with the characteristic impedance $Z_{SC}$ (for example, 100Ω). A conducting wire (long dashed short dashed line) of the standard cable SC and the high frequency signal line H (broken line) of the board bundle F are connected in series and an end of the high frequency signal line H which is not connected to the conducting wire of the standard cable SC is set as an open terminal. An end of the conducting wire of the standard cable SC which is not connected to the high frequency signal line H is connected to both of an output terminal of the square wave generator G and an input terminal of the oscilloscope O. In the device configuration described above, by changing the shape of the board bundle F in a shape corresponding to each rotation angle θ shown in FIGS. 5B to 5D, the characteristic impedance $Z_0$ of the high frequency signal line H at each rotation angle θ is measured.

FIG. 7B is a graph of a voltage which is measured by the oscilloscope O. A horizontal axis of FIG. 7B indicates the time and a vertical axis indicates the voltage. First, a predetermined square wave is output from the output terminal of the square wave generator G. An input voltage $V_1$ is measured by the oscilloscope O in a period $t_1$ (period in which the square wave has not arrived at the high frequency signal line H) in which the square wave is being transmitted through the standard cable SC. A voltage $V_3$ which is obtained by adding a reflection wave voltage $V_2$ in a boundary between the standard cable SC and the high frequency signal line H to the input voltage $V_1$ is measured by the oscilloscope O in a period $t_2$ (period in which the square wave has not arrived at the open terminal of the high frequency signal line H) in which the square wave is being transmitted through the high frequency signal line H after the period $t_1$. In addition, a voltage $V_5$ which is obtained by adding a reflection wave voltage $V_4$ in the open terminal of the high frequency signal line H to the voltage $V_3$ is measured by the oscilloscope O in a period $t_3$ which is after the square wave has arrived at the open terminal of the high frequency signal line H.

The characteristic impedance $Z_0$ of the high frequency signal line H is calculated by the following Equation (1).

$$Z_0=(1+\rho)/(1-\rho)\times Z_{SC} \qquad (1)$$

ρ in Equation (1) is $V_2/V_1$.

5. Other Embodiments

In the embodiment, the characteristic impedance $Z_0$ of the high frequency signal line H monotonously increases according to the rotation angle θ, but the characteristic impedance $Z_0$ may not compulsorily monotonously increase depending on the rotation angle θ. FIGS. 7C and 7D are schematic views showing the board bundle F of other embodiments. An area shown with hatching in FIGS. 7C and 7D indicates an area where the board bundle F is hardly moved. That is, the board bundle F can be moved in a movable area α which is not the area shown with hatching. When a wall surface having a concentric shape to the wiring core 23a is formed on the first member 23 or the second member 24, the ring-shaped movable area α shown in FIGS. 7C and 7D is formed. When the rotation angle θ is $\theta_{max}$ as shown in FIG. 7C, the wall surface for sectioning the movable area α and an outermost peripheral part of the board bundle F do not come into contact with each other and a slight gap is formed therebetween. Accordingly, when the rotation angle θ is increased from 0 to $\theta_{max}$, the winding diameter of the board bundle F increases depending on the rotation angle θ, without being limited by the wall surface sectioning the movable area α, and the inter-board distance Y is monotonously increases in the same manner as in FIGS. 5B to 5D of the embodiment. Therefore, when the rotation angle θ is increased from 0 to $\theta_{max}$ the characteristic impedance $Z_0$ of the high frequency signal line H also monotonously increases according to an increase in the rotation angle θ, as shown in FIG. 6B.

In other embodiments, the first member 23 and the second member 24 are linked to each other so that the rotation angle θ is increased to be greater than $\theta_{max}$. For example, as shown in FIG. 7D, when the rotation angle θ is $\theta_1$ ($>\theta_{max}$) which is greater than $\theta_{max}$, the board bundle F comes into contact with the wall surface sectioning the movable area α and an increase in the winding diameter of the outermost peripheral part of the board bundle F is prevented. Meanwhile, since the winding diameter on the inner side (winding core 23a side) with respect to the outermost peripheral part of the board bundle F increases, a distance between the outermost peripheral part and the inner side of the board bundle F decreases. Accordingly, when the rotation angle θ is increased from $\theta_{max}$ to $\theta_1$, the inter-board distance Y monotonously decreases according to an increase in the rotation angle θ.

FIG. 7E is a graph showing a relationship between the characteristic impedance $Z_0$ of the high frequency signal line H and the rotation angle θ of the other embodiment. A vertical axis of FIG. 7E indicates characteristic impedance $Z_O$ and a horizontal axis indicates the rotation angle θ (see FIGS. 5B to 5D and 7C and 7D). As described above, when the rotation angle θ is increased from $θ_{max}$ to $θ_1$, since the inter-board distance Y monotonously decreases according to an increase in the rotation angle θ, the characteristic impedance $Z_O$ also monotonously decreases according to an increase in the rotation angle θ, as shown in FIG. 7E. Accordingly, the characteristic impedance $Z_O$ has a maximum value in a change range (0 to $θ_1$) of the rotation angle θ. Even in such a case, as shown in FIG. 7E, by including the characteristic impedance $Z_{OT}$ of the connection wiring K in the change range J of the characteristic impedance $Z_O$ of the high frequency signal line H, it is possible to match the characteristic impedance even when the second member 24 is moved with respect to the first member 23.

When the characteristic impedance $Z_O$ of the high frequency signal line H has a maximum value, a line width of the high frequency signal line H may be designed so that the maximum value and the characteristic impedance $Z_{OT}$ of the connection wiring K coincide with each other. The characteristic impedance $Z_O$ of the high frequency signal line H may have a minimum value, and a line width of the high frequency signal line H may be designed so that the minimum value and the characteristic impedance $Z_{OT}$ of the connection wiring K coincide with each other. In addition, when the characteristic impedance $Z_O$ of the high frequency signal line H has a maximum value or a minimum value, a line width of the high frequency signal line H may be designed so that the characteristic impedance $Z_O$ of the high frequency signal line H at an intermediate angle in the change range of the rotation angle θ coincides with the characteristic impedance $Z_{OT}$ of the connection wiring K.

The first member 23 and the second member 24 may be members configuring the robot 9. The distal end portion of the arm 21 may not be compulsorily configured and a movable portion other than the arm 21 may be configured. The first member 23 and the second member 24 may be a member (configuration member of the hand 22) which is detachable from the robot 9. In addition, the wiring board W may be deformed to change the characteristic impedance $Z_O$, when the second member 24 is moved with respect to the first member 23, and the deformed state of the wiring board W is not limited to the change in the winding diameter. For example, both ends of the wiring board W formed in a spiral shape may be moved in the axial direction of the winding core. For example, when the second member 24 is moved with respect to the first member 23, a folding angle of the wiring board W which is folded in advance may change. The second member 24 may be linearly moved with respect to the first member 23. In addition, the wiring board W may not include the plurality of board wiring lines B and may include at least one board wiring line.

In addition, the shield board S may not be provided. For example, by deforming the wiring board W, a distance from the conductor other than the shield board S such as a housing may be changed to change the characteristic impedance $Z_O$. The wiring board W may not be interposed by the shield board S from both sides in the thickness direction, and the shield board S may be overlapped with the wiring board W only from one side in the thickness direction. The shield board S may not be a flexible printed wiring board including the conductor C on the entire surface and may be a flexible printed wiring board partially having the conductor C. The shield board S may include the conductor C having the shielding effect and the conductor C may not be connected to the ground.

The spacer I may not be compulsorily interposed between the wiring board W and a shield board S and the wiring board W and a shield board S may directly come into contact with each other. In this case, an amount of change of the characteristic impedance $Z_O$ of the board wiring lines B increases, but the spacer I may be omitted in such a case where the allowable range J of the characteristic impedance $Z_O$ is great. The spacer I may be configured so as to ensure a distance between the wiring board W and the shield board S, the wiring board W and the shield board S may not compulsorily have the same width, and a hole or a groove may be provided so that deformation resistance decreases. The connection wiring K and the board wiring line B may not be compulsorily connected to each other through an attenuator, and the attenuator may be omitted in such a case where a signal strength of a signal transmitted through the board signal line B is small, for example.

The entire disclosure of Japanese Patent Application No. 2014-217042, filed Oct. 24, 2014 is expressly incorporated by reference herein.

What is claimed is:

1. A robot comprising:
   a first member;
   a second member which is provided to be movable with respect to the first member;
   a connection wiring which is disposed on the first member; and
   a wiring board which is a flexible printed wiring board which includes a board wiring line connected to the connection wiring and is deformed according to movement of the second member with respect to the first member,
   wherein the characteristic impedance of the connection wiring is included in a change range of the characteristic impedance of the board wiring line corresponding to the deformation of the wiring board.

2. The robot according to claim 1,
   wherein an absolute value of a difference between the characteristic impedance of the connection wiring and a center value of the change range is equal to or smaller than 25% of the entire width of the change range.

3. The robot according to claim 1,
   wherein the characteristic impedance of the connection wiring and a center value of the change range are equivalent to each other.

4. The robot according to claim 1,
   wherein the change range is included in an allowable range which is set so as to include the characteristic impedance of the connection wiring.

5. The robot according to claim 1, further comprising:
   a shield board which is a flexible printed wiring board including a conductor and is disposed so that the conductor is overlapped with the wiring board in a thickness direction.

6. The robot according to claim 5,
   wherein a spacer is interposed between the wiring board and the shield board.

7. The robot according to claim 5,
   wherein the conductor of the shield board is connected to the ground.

8. The robot according to claim 1,
   wherein the wiring board is formed in a spiral shape in a width direction of the wiring board.

9. The robot according to claim 1,
wherein the connection wiring and the board wiring line are connected to each other through an attenuator.

\* \* \* \* \*